(12) United States Patent
Chuang et al.

(10) Patent No.: US 9,000,850 B2
(45) Date of Patent: Apr. 7, 2015

(54) METHOD AND APPARATUS FOR SELF-CALIBRATING DRIVING CAPABILITY AND RESISTANCE OF ON-DIE TERMINATION

(71) Applicant: Novatek Microelectronics Corp., Hsinchu (TW)

(72) Inventors: Yao-Cheng Chuang, Hsinchu County (TW); I-Huan Huang, Tainan (TW)

(73) Assignee: Novatek Microelectronics Corp., Hsinchu (TW)

( * ) Notice: Subject to any disclaimer, the term of this patent is extended or adjusted under 35 U.S.C. 154(b) by 35 days.

(21) Appl. No.: 13/893,362

(22) Filed: May 14, 2013

(65) Prior Publication Data
US 2014/0253250 A1    Sep. 11, 2014

(30) Foreign Application Priority Data
Mar. 11, 2013    (TW) .............................. 102108490 A

(51) Int. Cl.
| | | |
|---|---|---|
| H03K 3/03 | (2006.01) | |
| H03K 19/003 | (2006.01) | |
| G06F 13/40 | (2006.01) | |
| H03K 19/0175 | (2006.01) | |
| H03K 19/00 | (2006.01) | |

(52) U.S. Cl.
CPC ...... H03K 3/0315 (2013.01); H03K 19/017581 (2013.01); H03K 19/0005 (2013.01); H03K 19/017509 (2013.01); G06F 13/4086 (2013.01); H03K 19/00369 (2013.01)

(58) Field of Classification Search
CPC .......... H03K 3/0315; H03K 19/00369; H03K 19/003; H03K 19/017509; H03K 19/017581; H03K 19/0005; H03K 19/017545
USPC ............. 331/57, 44; 326/30, 32, 82; 374/141, 374/152, 163, 170
See application file for complete search history.

(56) References Cited

U.S. PATENT DOCUMENTS

| | | | | |
|---|---|---|---|---|
| 7,180,380 | B2 * | 2/2007 | Bienek et al. .................... | 331/66 |
| 7,455,450 | B2 * | 11/2008 | Liu et al. ........................ | 374/111 |
| 7,804,372 | B2 * | 9/2010 | Nakatani ......................... | 331/57 |
| 7,852,112 | B2 * | 12/2010 | Kao ................................. | 326/30 |
| 8,081,011 | B2 * | 12/2011 | Azimi et al. .................... | 326/33 |
| 8,570,063 | B2 * | 10/2013 | Grunzke ......................... | 326/30 |

* cited by examiner

Primary Examiner — Ryan Johnson
(74) Attorney, Agent, or Firm — Jianq Chyun IP Office

(57) ABSTRACT

A method and an apparatus for self-calibration of a driving capability and a resistance of an on-die termination are provided. The apparatus includes an output interface physical layer (PHY) and a ring oscillator. The output interface PHY receives an operation voltage. The ring oscillator surrounds the output interface PHY to sense a work temperature or the operation voltage and accordingly outputs a sensing result. The driving capability or the resistance of the on-die termination of the output interface PHY is adjusted according to the sensing result.

16 Claims, 2 Drawing Sheets

METHOD AND APPARATUS FOR SELF-CALIBRATING DRIVING CAPABILITY AND RESISTANCE OF ON-DIE TERMINATION

CROSS-REFERENCE TO RELATED APPLICATION

This application claims the priority benefit of Taiwan application serial no. 102108490, filed on Mar. 11, 2013. The entirety of the above-mentioned patent application is hereby incorporated by reference herein and made a part of this specification.

BACKGROUND

1. Technical Field

The invention relates to a method and an apparatus for self-calibration. Particularly, the invention relates to a method and an apparatus for self-calibrating a driving capability and a resistance of an on-die termination of an output interface physical layer.

2. Related Art

Along with development of semiconductor manufacturing technology, integrated circuits become possible, i.e. the circuits can be integrated into a chip. Since the chip has advantages of high performance and low cost, the integrated circuits become a trend. Moreover, since electronic apparatuses are gradually developed towards digitization, the integrated circuits are widely applied in the electronic apparatuses. However, since a signal transmission mode in internal of the chip is different to a signal transmission mode outside the chip, an output interface physical layer is configured in the chip to transmit signals in internal of the chip to external of the chip. Therefore, in order to correctly transmit the signals, stableness of the output interface physical layer becomes an important issue in device design (for example, chip design).

SUMMARY

The invention is directed to a method and an apparatus for self-calibrating a driving capability and a resistance of an on-die termination, by which a ring oscillator is used to sense variations of a working temperature and an operation voltage of an output interface physical layer, so as to adjust the driving capability and the resistance of the on-die termination of the output interface physical layer according to the variations of the working temperature and the operation voltage of the output interface physical layer without using an external precision resistor.

The invention provides an apparatus for self-calibrating a driving capability and a resistance of an on-die termination (ODT), which includes an output interface physical layer (PHY) and a ring oscillator. The output interface PHY receives an operation voltage. The ring oscillator surrounds the output interface PHY to sense a working temperature or the operation voltage of the output interface PHY and accordingly provides a sensing result, where the driving capability or the resistance of the ODT of the output interface PHY is adjusted according to the sensing result.

In an embodiment of the invention, the apparatus for self-calibrating the driving capability and the resistance of the ODT further includes a counter, which is coupled to the ring oscillator to perform counting according to a clock signal provided by the ring oscillator, where a counting value provided by the counter corresponds to the sensing result of the ring oscillator.

The invention provides an apparatus for self-calibrating a driving capability and a resistance of an ODT including an output interface PHY and a plurality of ring oscillators. The output interface PHY receives an operation voltage. The ring oscillators surround the output interface PHY to sense a working temperature or the operation voltage of the output interface PHY and accordingly provides a sensing result, where the driving capability or the resistance of the on-die termination (ODT) of the output interface PHY is adjusted according to the sensing result.

In an embodiment of the invention, the apparatus for self-calibrating the driving capability and the resistance of the ODT further comprises a plurality of counters and an averager. The counters are respectively coupled to the ring oscillators to perform counting according to a plurality of clock signals provided by the ring oscillators, and respectively provide a plurality of counting values. The averager is coupled to the counters, and calculates an average counting value of the counting values provided by the counters, where the average counting value corresponds to the sensing result of the ring oscillators.

In an embodiment of the invention, the output interface PHY has a driving capability register and a resistance register configured to determine the driving capability and the resistance of the ODT of the output interface PHY.

In an embodiment of the invention, the apparatus for self-calibrating the driving capability and the resistance of the ODT further comprises a control unit, which is coupled to the output interface PHY and the counter or the averager, and compares a reference counting value with the counting value provided by the counter or compares a reference average counting value with the average counting value provided by the averager, and adjusts values of the driving capability register and the resistance register according to a comparison result.

In an embodiment of the invention, when the counting value or the average counting value is equal to the reference counting value, the control unit does not adjust the values of the driving capability register and the resistance register. When the counting value or the average counting value is greater than the reference counting value, the control unit adjusts the values of the driving capability register and the resistance register to decrease the driving capability or increase the resistance of the ODT of the output interface PHY. When the counting value or the average counting value is smaller than the reference counting value, the control unit adjusts the values of the driving capability register and the resistance register to increase the driving capability or decrease the resistance of the ODT of the output interface PHY.

In an embodiment of the invention, the apparatus for self-calibrating the driving capability and the resistance of the ODT further comprises a memory device, which is coupled to the control unit for storing the reference counting value or the reference average counting value.

In an embodiment of the invention, the reference counting value is the counting value provided by the counter when the output interface PHY is in a room temperature and the operation voltage is a rated voltage.

In an embodiment of the invention, the reference average counting value is the average counting value provided by the averager when the output interface PHY is in a room temperature and the operation voltage is a rated voltage.

The invention provides a method for self-calibrating a driving capability and a resistance of an on-die termination (ODT), which includes following steps. At least one ring oscillator is used to sense a working temperature of an output interface PHY or an operation voltage received by the output interface PHY, so as to provide a sensing result. The driving capability or the resistance of the on-die termination of the output interface PHY is adjusted according to the sensing result.

In an embodiment of the invention, the step of adjusting the driving capability or the resistance of the ODT of the output interface PHY according to the sensing result comprises following steps. A counting value corresponding to the sensing result is obtained. A reference counting value is obtained, where the reference counting value is the counting value obtained when the output interface PHY is in a room temperature and the operation voltage is a rated voltage. The reference counting value and the counting value are compared, and the driving capability and the resistance of the ODT of the output interface PHY are adjusted according to a comparison result.

In an embodiment of the invention, the step of adjusting the driving capability or the resistance of the ODT of the output interface PHY according to the sensing result comprises following steps. When the counting value is equal to the reference counting value, the driving capability and the resistance of the ODT of the output interface PHY are not adjusted. When the counting value is greater than the reference counting value, the driving capability of the output interface PHY is decreased or the resistance of the ODT is increased. When the counting value is smaller than the reference counting value, the driving capability of the output interface PHY is increased or the resistance of the ODT is decreased.

In an embodiment of the invention, the at least one ring oscillator surrounds the output interface PHY.

According to the above descriptions, in the method and the apparatus for self-calibration of the driving capability and the resistance of the ODT of the invention, at least one ring oscillator is used to sense the working temperature or the operation voltage of the output interface PHY to obtain the sensing result, and adjust the driving capability or the resistance of the ODT of the output interface PHY according to the sensing result. In this way, the driving capability or the resistance of the ODT of the output interface PHY can be adjusted to suitable values without using an external precision resistor.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
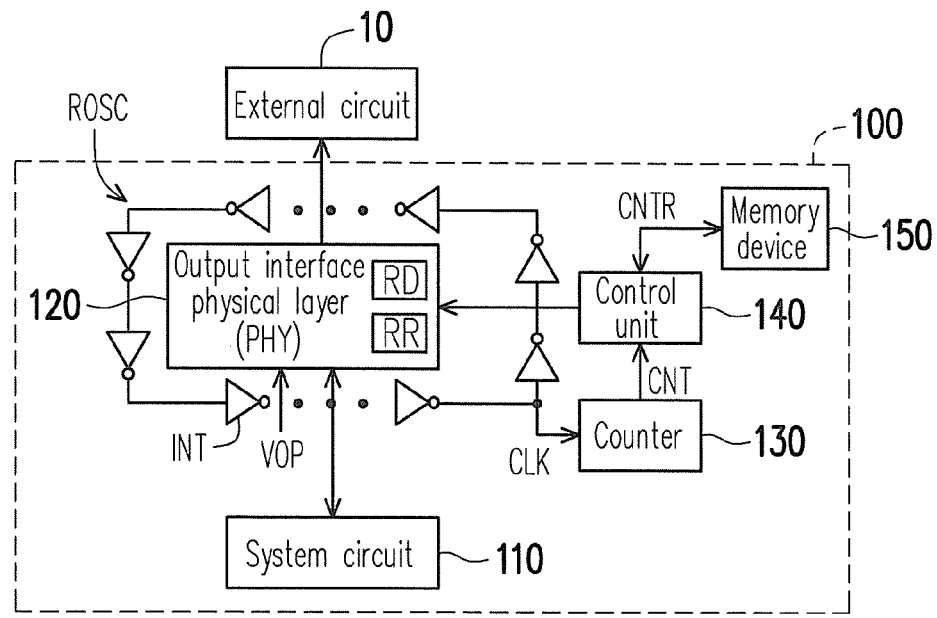
FIG. 1 is a system schematic diagram of an apparatus for self-calibrating a driving capability and a resistance of an on-die termination (ODT) according to an embodiment of the invention.

FIG. 1 is a system schematic diagram of an apparatus for self-calibrating a driving capability and a resistance of an on-die termination (ODT) according to an embodiment of the invention. Referring to FIG. 1, in the present embodiment, the apparatus 100 for self-calibrating the driving capability and the resistance of the ODT includes a system circuit 110, an output interface physical layer (PHY) 120, a ring oscillator ROSC, a counter 130, a control unit 140 and a memory device 150, where the output interface is, for example, a transmission interface of a universal serial bus (USB) 2.0 or a third generation double data rate (DDR3) memory, or a high definition multimedia interface (HDMI), etc. The memory device 150 is configured to store a reference counting value CNTR, and can be an electrically erasable programmable read-only memory (EEPROM), a flash memory or an electronic fuse (eFuse), etc. The output interface PHY 120 receives an operation voltage (VOP), and is coupled between the system circuit 110 and an external circuit 10, and is configured to transmit signals provided by the system circuit 110 to the external circuit 10, where the external circuit can be an electronic apparatus or an electronic device, which is not limited by the invention.

The ring oscillator ROSC is composed of a plurality of inverters INT connected in series, and provides a clock signal CLK, where the ring oscillator ROSC surrounds the output interface PHY 120. Since the ring oscillator ROSC surrounds the output interface PHY 120, a working temperature of the output interface PHY 120 influences the inverters INT, and a duty cycle (or a frequency) of the clock signal CLK is changed corresponding to the working temperature of the output interface PHY 120. Moreover, since the inverters INT and the output interface PHY 120 are all in the apparatus 100 for self-calibrating the driving capability and the resistance of the ODT, the operation voltage VOP received by the output interface PHY 120 and a power of the inverters INT are provided by a same power supply circuit (not shown), such that when the operation voltage VOP changes, the power of the inverters INT synchronously changes, and the duty cycle (or the frequency) of the clock signal CLK is changed corresponding to the operation voltage VOP of the output interface PHY 120.

According to the above description, the ring oscillator ROSC surrounding the output interface layer 120 may sense at least one of the working temperature and the operation voltage VOP of the output interface PHY 120 to change the duty cycle or the frequency of the clock signal CLK (which is equivalent to provide a sensing result). The counter 130 is coupled to the ring oscillator ROSC to perform counting according to the clock signal CLK provided by the ring oscillator ROSC. Since the counter 130 performs counting according to the clock signal CLK provided by the ring oscillator ROSC, a counting value CNT provided by the counter 130 corresponds to the sensing result that the ring oscillator ROSC senses at least one of the working temperature and the operation voltage VOP of the output interface PHY 120.

The control unit 140 is coupled to the output interface PHY 120 and the counter 130, so as to adjust at least one of the driving capability (for example, the driving current) and the resistance of the ODT of the output interface PHY 120 according to the counting value CNT provided by the counter 130, i.e. at least one of the driving capability and the resistance of the ODT of the output interface PHY 120 is adjusted according to the sensing result provided by the ring oscillator ROSC. Further, the control unit 140 is coupled to the memory device 150 to receive a reference counting value CNTR, and the control unit 140 compares the reference counting value CNTR with the counting value CNT currently provided by the counter 130 to determine whether or not to adjust at least one of the driving capability and the resistance of the ODT of the output interface PHY 120. When the output interface PHY 120 is in a room temperature (for example, 25° C.) and the operation voltage VOP is a rated voltage (for example, 1.0V), the control unit 140 stores the counting value CNT provided by the counter 130 to the memory device 150 to serve as the reference counting value CNTR.

In the present embodiment, the output interface PHY 120, for example, has a driving capability register RD and a resistance register RR used for determining the driving capability and the resistance of the ODT of the output interface PHY 120. Therefore, the control unit 140 compares the reference counting value CNTR with the counting value CNT currently provided by the counter 130, and determines whether to adjust a value of at least one of the driving capability register RD and the resistance register RR according to a comparison result.

Further, when the counting value CNT is equal to the reference counting value CNTR, it represents that signal outputting capability of the output interface PHY 120 is the same as expectation, and the control unit 140 does not adjust the values of the of the driving capability register RD and the resistance register RR. When the counting value CNT is greater than the reference counting value CNTR, it represents that the signal outputting capability of the output interface PHY 120 is higher than expectation, and the control unit 140 adjusts the value of at least one of the driving capability register RD and the resistance register RR to decrease the driving capability or increase the resistance of the ODT of the output interface PHY 120, or decrease the driving capability and increase the resistance of the ODT of the output interface PHY 120. When the counting value CNT is smaller than the reference counting value CNTR, it represents that the signal outputting capability of the output interface PHY 120 is lower than expectation, and the control unit 140 adjusts the value of at least one of the driving capability register RD and the resistance register RR to increase the driving capability or decrease the resistance of the ODT of the output interface PHY 120, or increase the driving capability and decrease the resistance of the ODT of the output interface PHY 120.

A following table one is an adjustment comparison table of the driving capability and the resistance of the ODT of the output interface PHY 120 according to an embodiment of the invention, where the adjustment of the driving capability and the resistance of the ODT of the output interface PHY 120 can be continuously performed or periodically performed (for example, once per second). As shown in the table 1, when an operation state of the output interface PHY 120 has a lower operation voltage VOP and/or a higher working temperature, the counting value CNT currently provided by the counter 130 is smaller than a reference counting value X. When the counting value CNT is X−100, the control unit 140 adjusts the value of at least one of the driving capability register RD and the resistance register RR to increase the driving capability by one order or decrease the resistance of the ODT by one order, or increase the driving capability by one order and decrease the resistance of the ODT by one order. When the counting value CNT is X−200, the control unit 140 adjusts the value of at least one of the driving capability register RD and the resistance register RR to increase the driving capability by two orders or decrease the resistance of the ODT by two orders, or increase the driving capability by two orders and decrease the resistance of the ODT by two orders.

When the operation state of the output interface PHY 120 has a standard voltage and a standard temperature, the counting value CNT currently provided by the counter 130 is equal to the reference counting value X, and now the control unit 140 does not adjust the values of the driving capability register RD and the resistance register RR to maintain the driving capability and maintain the resistance of the ODT. When the operation state of the output interface PHY 120 has a higher operation voltage VOP and/or a lower working temperature, the counting value CNT currently provided by the counter 130 is greater than the reference counting value X. When the counting value CNT is X+100, the control unit 140 adjusts the value of at least one of the driving capability register RD and the resistance register RR to decrease the driving capability by one order or increase the resistance of the ODT by one order, or decrease the driving capability by one order and increase the resistance of the ODT by one order. When the counting value CNT is X+200, the control unit 140 adjusts the value of at least one of the driving capability register RD and the resistance register RR to decrease the driving capability by two orders or increase the resistance of the ODT by two orders, or decrease the driving capability by two orders and increase the resistance of the ODT by two orders. An adjustment amount corresponding to the one order driving capability and an adjustment amount corresponding to the one order resistance can be designed by those skilled in the art and according to the circuit requirement, and is not limited by the invention.

TABLE 1

| | State | | | | |
|---|---|---|---|---|---|
| | Low voltage/ high temperature | Low voltage/ high temperature | Standard voltage/ standard temperature | High voltage/ low temperature | High voltage/ low temperature |
| Counting value | X − 200 | X − 100 | Reference counting value X | X + 100 | X + 200 |
| Adjustment | Increase driving capability by two orders, decrease resistance of ODT by two orders | Increase driving capability by one order, decrease resistance of ODT by one order | Maintain driving capability, maintain resistance of ODT | Decrease driving capability by one order, increase resistance of ODT by one order | Decrease driving capability by two orders, increase resistance of ODT by two orders |

According to the above description, 100 is taken as one adjustment pitch, which can be adjusted according to the quantity of the inverters INT of the ring oscillator ROSC, for example, when the quantity of the inverters INT of the ring oscillator ROSC is larger, the adjustment pitch can be decreased, and when the quantity of the inverters INT of the ring oscillator ROSC is smaller, the adjustment pitch can be increased. Moreover, when the counting value CNT currently provided by the counter 130 is not indicated in the table 1, an interpolation operation can be performed according to the adjustment shown in the table 1 to determine an adjustment amount of the driving capability and an adjustment amount of the resistance of the ODT corresponding to the current counting value CNT.

In the present embodiment, the control unit 140 is independently configured in the apparatus 100 for self-calibrating the driving capability and the resistance of the ODT, though in other embodiments, the control unit 140 can be integrated into the system circuit 110. Moreover, in some embodiments, the control unit 140 can be implemented by a circuit, though in some other embodiments, the control unit 140 can be implemented by software. The aforementioned implementations of the control unit 140 are only example, and the invention is not limited thereto.

Figure 2:
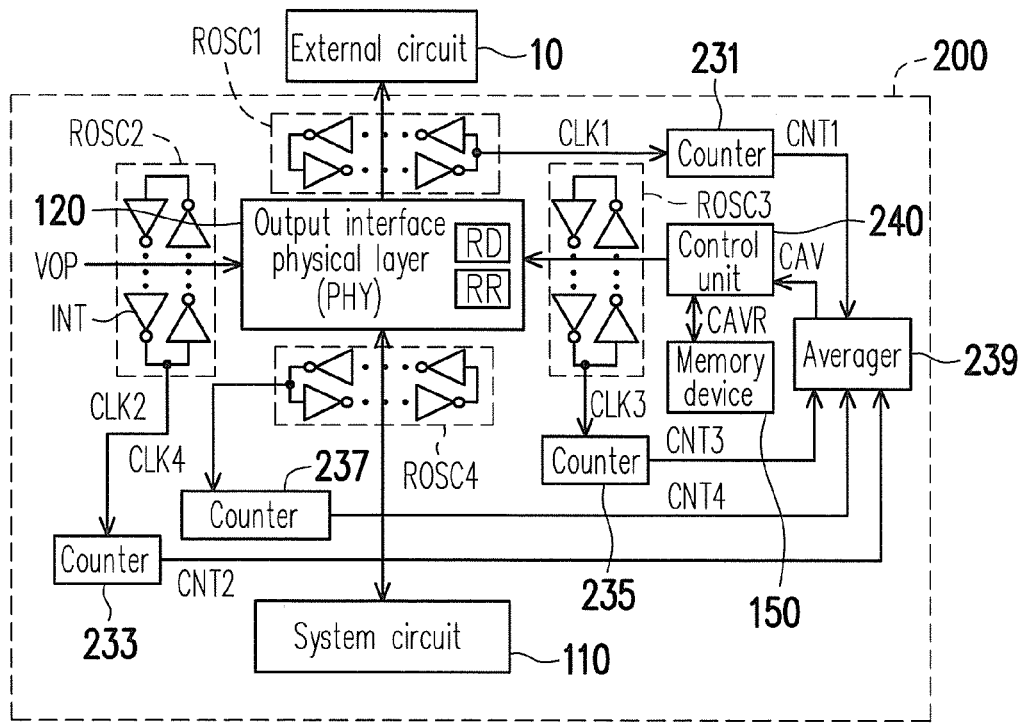
FIG. 2 is a system schematic diagram of an apparatus for self-calibrating a driving capability and a resistance of an ODT according to another embodiment of the invention.

FIG. 2 is a system schematic diagram of an apparatus for self-calibrating a driving capability and a resistance of an ODT according to another embodiment of the invention. Referring to FIG. 1 and FIG. 2, the same or similar devices are denoted by the same or similar symbols. In the present embodiment, the apparatus 200 for self-calibrating the driving capability and the resistance of the ODT includes the system circuit 110, the output interface PHY 120, ring oscillators ROSC1-ROSC4, counters 231, 233, 235 and 237, an averager 239, a control unit 240 and the memory device 150. The memory device 150 is configured to store a reference average counting value CAVR.

The ring oscillators ROSC1-ROSC4 are respectively composed of a plurality of inverters INT connected in series, and respectively provide clock signals CLK1-CLK4, where the ring oscillators ROSC1-ROSC4 surround the output interface PHY 120. Since the ring oscillators ROSC1-ROSC4 surround the output interface PHY 120, the working temperature of the output interface PHY 120 influences at least a part of the inverters INT in the ring oscillators ROSC1-ROSC4, and duty cycles (or frequencies) of the clock signals CLK1-CLK4 are changed corresponding to the working temperature of the output interface PHY 120. Moreover, since the inverters INT and the output interface PHY 120 are all in the apparatus 200 for self-calibrating the driving capability and the resistance of the ODT, the operation voltage VOP received by the output interface PHY 120 and a power of the inverters INT are provided by a same power supply circuit (not shown), such that when the operation voltage VOP changes, the power of the inverters INT synchronously changes, and the duty cycles (or the frequencies) of the clock signals CLK1-CLK4 are changed corresponding to the operation voltage VOP of the output interface PHY 120.

According to the above description, the ring oscillators ROSC1-ROSC4 surrounding the output interface layer 120 may sense at least one of the working temperature and the operation voltage VOP of the output interface PHY 120 to change the duty cycles or the frequencies of the clock signals CLK1-CLK4 (which is equivalent to provide a sensing result). The counter 231 is coupled to the ring oscillator ROSC1 to perform counting according to the clock signal CLK1 provided by the ring oscillator ROSC1, and a counting value CNT1 provided by the counter 231 corresponds to the sensing result that the ring oscillator ROSC1 senses at least one of the working temperature and the operation voltage VOP of the output interface PHY 120.

The counter 233 is coupled to the ring oscillator ROSC2 to perform counting according to the clock signal CLK2 provided by the ring oscillator ROSC2, and a counting value CNT2 provided by the counter 233 corresponds to the sensing result that the ring oscillator ROSC2 senses at least one of the working temperature and the operation voltage VOP of the output interface PHY 120. The counter 235 is coupled to the ring oscillator ROSC3 to perform counting according to the clock signal CLK3 provided by the ring oscillator ROSC3, and a counting value CNT3 provided by the counter 235 corresponds to the sensing result that the ring oscillator ROSC3 senses at least one of the working temperature and the operation voltage VOP of the output interface PHY 120.

The counter 237 is coupled to the ring oscillator ROSC4 to perform counting according to the clock signal CLK4 provided by the ring oscillator ROSC4, and a counting value CNT4 provided by the counter 237 corresponds to the sensing result that the ring oscillator ROSC4 senses at least one of the working temperature and the operation voltage VOP of the output interface PHY 120. The averager 239 is coupled to the counters 231, 233, 235 and 237, and calculates an average counting value CAV according to the counting values CNT1-CNT4 provided by the counters 231, 233, 235 and 237. Since the counting values CNT1-CNT4 respectively correspond to the sensing results that the ring oscillators ROSC1-ROSC4 sense at least one of the working temperature and the operation voltage VOP of the output interface PHY 120, the counting values CNT1-CNT4 correspond to a whole sensing result that the ring oscillators ROSC1-ROSC4 sense at least one of the working temperature and the operation voltage VOP of the output interface PHY 120.

The control unit 240 is coupled to the output interface PHY 120 and the averager 239, so as to adjust at least one of the driving capability (for example, the driving current) and the resistance of the ODT of the output interface PHY 120 according to the average counting value CAV provided by the averager 239, i.e. at least one of the driving capability and the resistance of the ODT of the output interface PHY 120 is adjusted according to the sensing results provided by the ring oscillators ROSC1-ROSC4. Further, the control unit 240 is coupled to the memory device 150 to receive a reference average counting value CAVR, and the control unit 240 compares the reference average counting value CAVR with the average counting value CAV currently provided by the averager 239 to determine whether or not to adjust at least one of the driving capability and the resistance of the ODT of the output interface PHY 120. When the output interface PHY 120 is in a room temperature (for example, 25° C.) and the operation voltage VOP is a rated voltage (for example, 1.0V), the control unit 240 stores the average counting value CAV provided by the averager 239 to the memory device 150 to serve as the reference average counting value CAVR.

In the present embodiment, the output interface PHY 120, for example, has a driving capability register RD and a resistance register RR used for determining the driving capability and the resistance of the ODT of the output interface PHY 120. Therefore, the control unit 240 compares the reference average counting value CAVR with the average counting value CAV currently provided by the averager 239, and determines whether to adjust a value of at least one of the driving capability register RD and the resistance register RR according to a comparison result.

Further, when the average counting value CAV is equal to the reference average counting value CAVR, it represents that signal outputting capability of the output interface PHY 120 is the same as expectation, and the control unit 240 does not adjust the values of the of the driving capability register RD and the resistance register RR. When the average counting value CAV is greater than the reference average counting value CAVR, it represents that the signal outputting capability of the output interface PHY 120 is higher than expectation, and the control unit 240 adjusts the value of at least one of the driving capability register RD and the resistance register RR to decrease the driving capability or increase the resistance of the ODT of the output interface PHY 120, or decrease the driving capability and increase the resistance of the ODT of the output interface PHY 120. When the average counting value CAV is smaller than the reference average counting value CAVR, it represents that the signal outputting capability of the output interface PHY 120 is lower than expectation, and the control unit 240 adjusts the value of at least one of the driving capability register RD and the resistance register RR to increase the driving capability or decrease the resistance of the ODT of the output interface PHY 120, or increase the driving capability and decrease the resistance of the ODT of the output interface PHY 120. The aforementioned adjustment can refer to the table 1 and related descriptions thereof, and details thereof are not repeated.

In the present embodiment, the four ring oscillators ROSC1-ROSC4 are used to sense at least one of the working temperature and the operation voltage VOP of the output interface PHY 120 to output the corresponding sensing result, though in other embodiments, one of the ring oscillators ROSC1-ROSC4 is used to sense at least one of the working temperature and the operation voltage VOP of the output interface PHY 120, two of the ring oscillators ROSC1-ROSC4 are used to sense at least one of the working temperature and the operation voltage VOP of the output interface PHY 120, or three of the ring oscillators ROSC1-ROSC4 are used to sense at least one of the working temperature and the operation voltage VOP of the output interface PHY 120, which is determined by those skilled in the art and is not limited by the invention.

Figure 3:
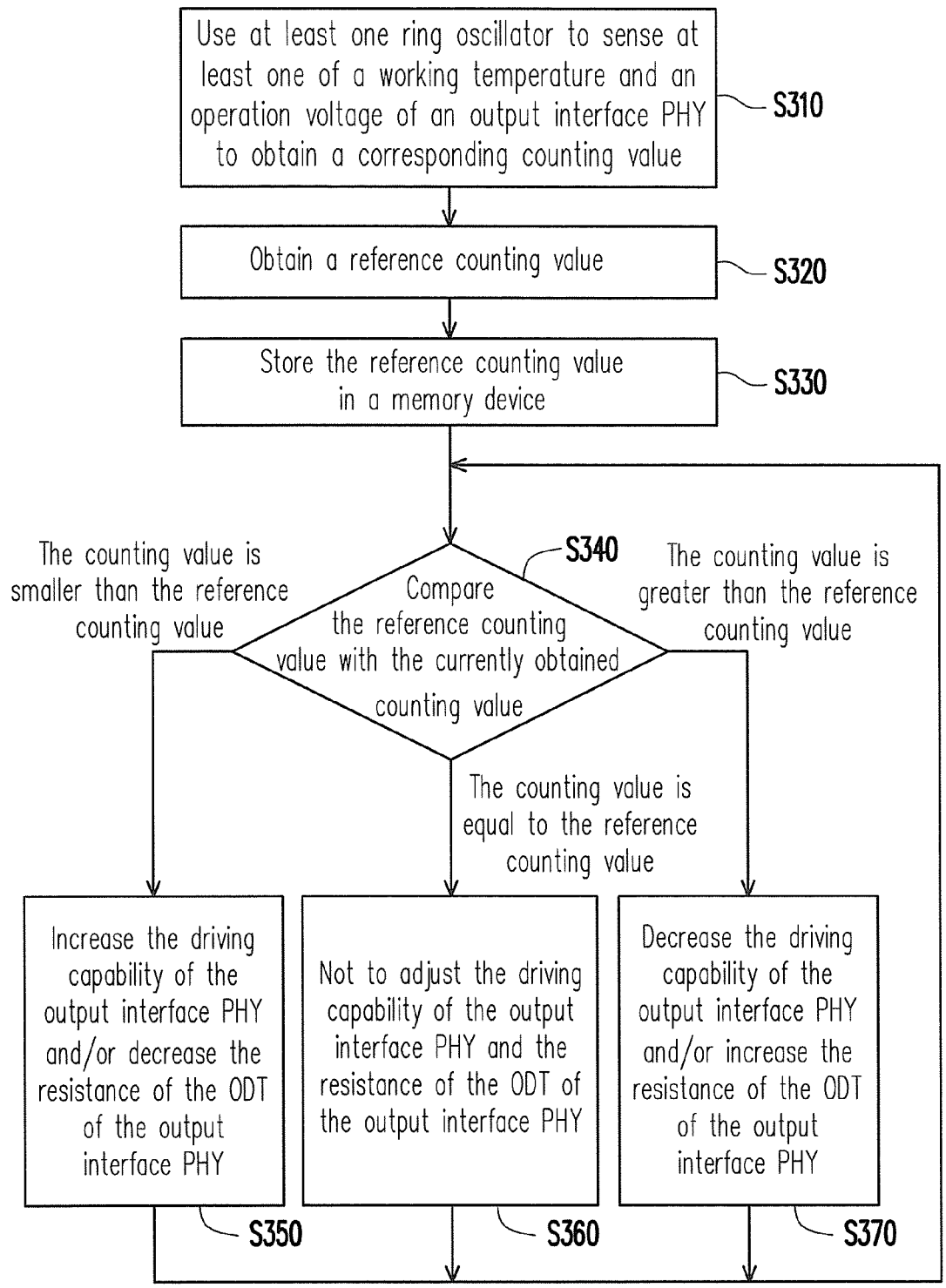
FIG. 3 is a flowchart illustrating a method for self-calibrating a driving capability and a resistance of an ODT according to an embodiment of the invention.

FIG. 3 is a flowchart illustrating a method for self-calibrating a driving capability and a resistance of an ODT according to an embodiment of the invention. Referring to FIG. 3, in the present embodiment, at least one ring oscillator is used to sense at least one of a working temperature and an operation voltage of an output interface PHY to obtain a corresponding counting value (step S310), where the ring oscillator surrounds the output interface PHY. Then, a reference counting value is obtained (step S320), and the reference counting value is stored in a memory device (step S330), where the reference counting value can be the counting value corresponding when the output interface PHY is in a room temperature (for example, 25° C.) and the operation voltage VOP is a rated voltage (for example, 1.0V). Then, the reference counting value is compared with the currently obtained counting value (step S340). When the counting value is smaller than the reference counting value, the driving capability of the output interface PHY is increased and/or the resistance of the ODT of the output interface PHY is decreased (step S350). When the counting value is equal to the reference counting value, the driving capability of the output interface PHY and the resistance of the ODT of the output interface PHY are not adjusted (step S360). When the counting value is greater than the reference counting value, the driving capability of the output interface PHY is decreased and/or the resistance of the ODT of the output interface PHY is increased (step S370). After the steps S350, S360 and S370, the flow returns to the step S340 to continually monitor at least one of the working temperature and the operation voltage of the output interface PHY, and adjust the driving capability of the output interface PHY and/or the resistance of the ODT of the output interface PHY to suitable values. The sequence of the aforementioned steps is only an example, and the invention is not limited thereto. Moreover, details of the aforementioned steps may refer to related descriptions of the embodiments of FIG. 1 and FIG. 2, and are not repeated.

In summary, in the method and the apparatus for self-calibration of the driving capability and the resistance of the ODT of the invention, at least one ring oscillator is used to surround the output interface PHY and sense the working temperature and/or the operation voltage of the output interface PHY to obtain the corresponding counting value, and the reference counting value is compared with the currently obtained counting value to determine whether the driving capability of the output interface PHY and/or the resistance of the ODT of the output interface PHY is required to be adjusted. In this way, the driving capability of the output interface PHY and/or the resistance of the ODT of the output interface PHY can be adjusted to suitable values without using an external precision resistor.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An apparatus for self-calibrating a driving capability and a resistance of an on-die termination (ODT), comprising:
   an output interface physical layer (PHY), receiving an operation voltage; and
   a ring oscillator, surrounding the output interface PHY to sense a working temperature or the operation voltage of the output interface PHY and accordingly outputting a sensing result, wherein the driving capability or the resistance of the ODT of the output interface PHY is adjusted according to the sensing result.

2. The apparatus for self-calibrating the driving capability and the resistance of the ODT as claimed in claim 1, further comprising:
   a counter, coupled to the ring oscillator, and performing counting according to a clock signal provided by the ring oscillator, wherein a counting value provided by the counter corresponds to the sensing result of the ring oscillator.

3. The apparatus for self-calibrating the driving capability and the resistance of the ODT as claimed in claim 2, wherein the output interface PHY has a driving capability register and a resistance register configured to determine the driving capability and the resistance of the ODT of the output interface PHY.

4. The apparatus for self-calibrating the driving capability and the resistance of the ODT as claimed in claim 3, further comprising:
   a control unit, coupled to the output interface PHY and the counter, and comparing a reference counting value with the counting value provided by the counter, and adjusting values of the driving capability register and the resistance register according to a comparison result.

5. The apparatus for self-calibrating the driving capability and the resistance of the ODT as claimed in claim 4, wherein when the counting value is equal to the reference counting value, the control unit does not adjust the values of the driving capability register and the resistance register, when the counting value is greater than the reference counting value, the control unit adjusts the values of the driving capability register and the resistance register to decrease the driving capability or increase the resistance of the ODT of the output interface PHY, and when the counting value is smaller than the reference counting value, the control unit adjusts the values of the driving capability register and the resistance register to increase the driving capability or decrease the resistance of the ODT of the output interface PHY.

6. The apparatus for self-calibrating the driving capability and the resistance of the ODT as claimed in claim 4, further comprising:
   a memory device, coupled to the control unit, and configured to store the reference counting value.

7. The apparatus for self-calibrating the driving capability and the resistance of the ODT as claimed in claim 4, wherein the reference counting value is the counting value provided by the counter when the output interface PHY is in a room temperature and the operation voltage is a rated voltage.

8. An apparatus for self-calibrating a driving capability and a resistance of an on-die termination (ODT), comprising:

an output interface physical layer (PHY), receiving an operation voltage;
a plurality of ring oscillators, surrounding the output interface PHY to sense a working temperature or the operation voltage of the output interface PHY to provide a sensing result, wherein the driving capability or the resistance of the ODT of the output interface PHY is adjusted according to the sensing result;
a plurality of counters, respectively coupled to the ring oscillators to perform counting according to a plurality of clock signals provided by the ring oscillators, and respectively providing a plurality of counting values; and
an averager, coupled to the counters, and calculating an average counting value of the counting values provided by the counters, wherein the average counting value corresponds to the sensing result of the ring oscillators.

9. The apparatus for self-calibrating the driving capability and the resistance of the ODT as claimed in claim 8, wherein the output interface PHY has a driving capability register and a resistance register configured to determine the driving capability and the resistance of the ODT of the output interface PHY.

10. The apparatus for self-calibrating the driving capability and the resistance of the ODT as claimed in claim 9, further comprising:
a control unit, coupled to the output interface PHY and the averager, and comparing a reference average counting value with the average counting value, and adjusting values of the driving capability register and the resistance register according to a comparison result.

11. The apparatus for self-calibrating the driving capability and the resistance of the ODT as claimed in claim 10, wherein when the average counting value is equal to the reference average counting value, the control unit does not adjust the values of the driving capability register and the resistance register, when the average counting value is greater than the reference average counting value, the control unit adjusts the values of the driving capability register and the resistance register to decrease the driving capability or increase the resistance of the ODT of the output interface PHY, and when the average counting value is smaller than the reference average counting value, the control unit adjusts the values of the driving capability register and the resistance register to increase the driving capability or decrease the resistance of the ODT of the output interface PHY.

12. The apparatus for self-calibrating the driving capability and the resistance of the ODT as claimed in claim 10, further comprising:
a memory device, coupled to the control unit, and configured to store the reference average counting value.

13. The apparatus for self-calibrating the driving capability and the resistance of the ODT as claimed in claim 10, wherein the reference average counting value is the average counting value provided by the averager when the output interface PHY is in a room temperature and the operation voltage is a rated voltage.

14. A method for self-calibrating a driving capability and a resistance of an on-die termination (ODT), comprising:
using at least one ring oscillator to sense a working temperature of an output interface PHY or an operation voltage received by the output interface PHY, so as to provide a sensing result; and
adjusting the driving capability or the resistance of the ODT of the output interface PHY according to the sensing result, comprising
obtaining a counting value corresponding to the sensing result;
obtaining a reference counting value, wherein the reference counting value is the counting value obtained when the output interface PHY is in a room temperature and the operation voltage is a rated voltage; and
comparing the reference counting value with the counting value, and adjusting the driving capability or the resistance of the ODT of the output interface PHY according to a comparison result.

15. The method for self-calibrating the driving capability and the resistance of the ODT as claimed in claim 14, wherein the step of adjusting the driving capability or the resistance of the ODT of the output interface PHY according to the comparison result comprises:
not to adjust the driving capability and the resistance of the ODT of the output interface PHY when the counting value is equal to the reference counting value;
decreasing the driving capability of the output interface PHY or increasing the resistance of the ODT of the output interface PHY when the counting value is greater than the reference counting value; and
increasing the driving capability of the output interface PHY or decreasing the resistance of the ODT of the output interface PHY when the counting value is smaller than the reference counting value.

16. The method for self-calibrating the driving capability and the resistance of the ODT as claimed in claim 14, wherein the at least one ring oscillator surrounds the output interface PHY.

\* \* \* \* \*